United States Patent [19]

Lapeyre

[11] Patent Number: 4,910,697
[45] Date of Patent: Mar. 20, 1990

[54] PROGRAMMABLE COMPUTER WITH ALPHANUMERIC CAPABILITIES HAVING FEW KEYBOARD KEYS

[75] Inventor: James M. Lapeyre, New Orleans, La.

[73] Assignee: The Laitram Corporation, New Orleans, La.

[21] Appl. No.: 331,049

[22] Filed: Mar. 29, 1989

Related U.S. Application Data

[63] Continuation of Ser. No. 729,559, May 2, 1985, abandoned, which is a continuation-in-part of Ser. No. 459,998, Jan. 21, 1983, Pat. No. 4,547,860.

[51] Int. Cl.$^4$ ............................................. G06F 3/023
[52] U.S. Cl. ............................ 364/709.16; 364/709.15
[58] Field of Search ....................... 364/709.16, 709.15; 341/22

[56] References Cited

U.S. PATENT DOCUMENTS

| | | | |
|---|---|---|---|
| 3,675,513 | 7/1972 | Flanagan et al. | 379/104 |
| 3,892,958 | 7/1975 | Tung | 364/709.15 |
| 3,967,273 | 6/1976 | Knowlton | 341/22 |
| 4,120,040 | 10/1978 | Aihara | 364/709.15 |
| 4,202,038 | 5/1980 | Petersson | 364/709.15 |
| 4,272,826 | 6/1981 | Deutsch | 364/709.15 |
| 4,279,022 | 7/1981 | Abe | 364/900 |
| 4,302,816 | 11/1981 | Yamamoto | 364/709.16 |
| 4,344,069 | 8/1982 | Prame | 341/26 |

Primary Examiner—David M. Malzahn
Attorney, Agent, or Firm—Laurence R. Brown; Alfred J. Mangels

[57] ABSTRACT

Provision is made in programmable alphanumeric calculator systems to provide functional controls from the keyboard for setting up various keyboard operational modes so that fewer keys on the keyboard are necessary. Thus, computer control commands are initiated in a control mode for entries of the commands in response for two successive keystrokes. In particular the entry of a full set of twenty six alphabetic characters typically with fewer than twelve keys is achieved by providing a different operating mode than for the entry of numeric digits from the keys with a single keystroke. Accordingly the alphabetic characters are entered with two successive keystrokes from a subset of six or more keys in different embodiments.

2 Claims, 4 Drawing Sheets

| 1 | 2 | 3 |
|---|---|---|
| A$_1$ B$_3$ C$_6$ / J$_4$ K$_5$ L$_2$ | D$_1$ E$_2$ F$_6$ / M$_4$ N$_3$ O$_5$ | G$_4$ H$_2$ I$_3$ / P$_5$ Q$_1$ R$_6$ |
| S$_1$ T$_4$ U$_5$ / W$_6$ X$_2$ Y$_3$ | V$_6$ 1$_1$ 2$_2$ / Z$_5$ 6$_4$ 7$_3$ | 3$_3$ 4$_4$ 5$_5$ / 8$_2$ 9$_1$ 0$_6$ |
| 4 | 5 | 6 |

FIG. 5

| 7 | 8 | 9 |
|---|---|---|
| A7 B3 C9 / J2 K8 L6 / S1 T4 U5 / . : 0 X/Q | D7 E5 F8 / M9 N4 O6 / V3 W1 X2 / ; ' 0 X/Q | G7 H9 I6 / P5 Q8 R3 / Y1 Z2 - 4 / ? ÷ 0 X/Q |
| 1 | 2 | 3 |
| ∴ | 0 | X |

FIG. 4

PROGRAMMABLE COMPUTER WITH ALPHANUMERIC CAPABILITIES HAVING FEW KEYBOARD KEYS

This application is a continuation, of application Ser. No. 06/729,559, filed May 2, 1985, now abandoned, which is a continuation-in-part of U.S. Ser. No. 459,998 filed Jan. 21, 1983 for "Computer Keyboards With Few Keys Designating Hundreds of Functions", now U.S. Pat. No. 4,547,860 granted Oct. 15, 1985. That application is incorporated herein in its entirety by reference.

TECHNICAL FIELD

This invention relates to keyboards for inputting alphanumeric instructions and/or data into computers and more particularly it relates to the facile input of alpha characters using two discrete key strokes per character while requiring as few as six discrete keys.

BACKGROUND ART

That application, and other disclosures such as U.S. Pat. No. 3,892,958 to C. Tung of July 1, 1975; U.S. Pat. No. 3,967,273 to K. Knowlton of June 29, 1976; and European Patent Application 11,307 filed Nov. 19, 1979 all relate to the multiple use of keyboard keys for reducing the number of keys required on a keyboard for processing data. This is particularly desirable for miniaturized multi-purpose computer systems now feasible in the art which are capable of many hundreds of functions and which may require both numerics and alphabets in their communication, calculating and data processing operations.

The Knowlton patent, for example, reduces the number of keys required for alphanumeric capabilities to twelve by requiring two successive choices for every entry digit such as numeral 2 or letter k. The Tung patent provides for each key to have at least three functions with two sets of functions respectively chosen by respective orange or blue prefix key so that a calculator with thirty-two keys can be used for about three times that many functional computer entries including instructions and data. This latter concept is used, for example, in "Hewlett-Packard" Model HP-41 type programmable calculators with full alphabetic capabilities. Similarly "Texas Instruments" TI-88 line of programmable calculators have alphabetic capabilities with two keyboard functions selectable, plus an alphabetic entry mode.

The general state of the art of calculator systems with complex many functional capacity is represented by U.S. Pat. No. 3,863,060 to F. Rode et al., of Jan. 28, 1975.

However, the state of such prior art calculators has made programming and particularly programming in the alpha mode awkward and time consuming because of the necessity to sequence varying multiples of keystroke entries for entering alphabet letters into program steps being formulated.

Also, many of these prior art calculators have introduced alpha capabilities at the expense of utilizing 26 separate keys for the alphabet. Thus, calculators or computers with few key keyboards in the art have been deficient in their capacity to control many calculator functions with concurrent alphanumeric capability that can be easily used and rapidly programmed in the alphanumeric mode.

It is therefore an objective of this invention to provide improved alphanumeric capabilities in computers and data processing systems, and in particular to overcome the aforesaid deficiencies of the prior art. Other objects, features and advantages will be found throughout the following description, drawing and claims.

DISCLOSURE OF THE INVENTION

A keyboard and system for operating same is provided having increased efficiency of the number of functions performable by a small number of keys, such as twelve or sixteen. The keyboard provides for entry of both calculator command functions and a full set of alphanumeric characters. Thus, the system is operable in three modes that are successively selected from the keyboard, namely, (a) a calculating keyboard mode (normal mode) for primary entry of a first set of data and control functions in response to single keystrokes, (b) a control mode for entry of command functions in response to at least two keystrokes from predetermined combinations of the keys, and (c) a programming mode for entry of alphanumeric data and commands in response to at least two keystrokes from predetermined combinations of a subset of said keys.

In particular, significant advantage is obtained in a programmable calculator with alphanumeric capabilities, namely the facile entry of alphanumeric entries in the alpha mode. In this two stroke mode it is possible to enter the full 26 letter alphabet plus the numbers 1 through 0 with as few as six keys, although seven keys is the reasonable minimum since some decimal and control functions are usually required. It is preferable however, that the working minimum number of keys be 12, because the use of 12 keys permits the decimal digits 0 through 9, the decimal point and a control function, to all be executed in a single stroke mode. The entry of a single letter on the other hand requires 2 distinct keystrokes. The speed of entry is not hampered, however, since the area of search, (compared to a single key, single letter keyboard) for the desired letter is reduced to about 1/9 of the single stroke keyboard and is, for example contained in a very small area occupied by only, for example, 3 keys. In fact, searching over such a small area for the desired letter, (on one of 3 keys), touching that key and then touching a second key at a known position, as indicated by the first key touched, is sometimes faster than searching for a letter among 26 keys and then striking that key once. Obviously this system is more efficacious for the Hunt & Peck method of alpha entry over the touch system. None-the-less, it is easily learned and for persons so inclined it soon becomes as facile if not more so than the usual single-key single-letter system requiring so many more keys.

BRIEF DESCRIPTION OF THE DRAWINGS

In the drawings:

FIG. 1 is a plan view of a preferred embodiment of a keyboard layout embodying the invention and having all 26 of the alphabet letters located on only 3 of the sixteen keys.

FIG. 3 is a 6-key keyboard layout capable of entering all 26 letters of the alphabet and the decimal digits 0 through 9 in a two-stroke mode.

FIG. 4 is a 7-keyboard capable of entering all alpha numerics plus many other functions.

FIG. 5 is an embodiment for calculator use showing the prefered minimum number of keys wherein the numerics can be single stroke operated.

THE PREFERRED EMBODIMENT

Figure 1:
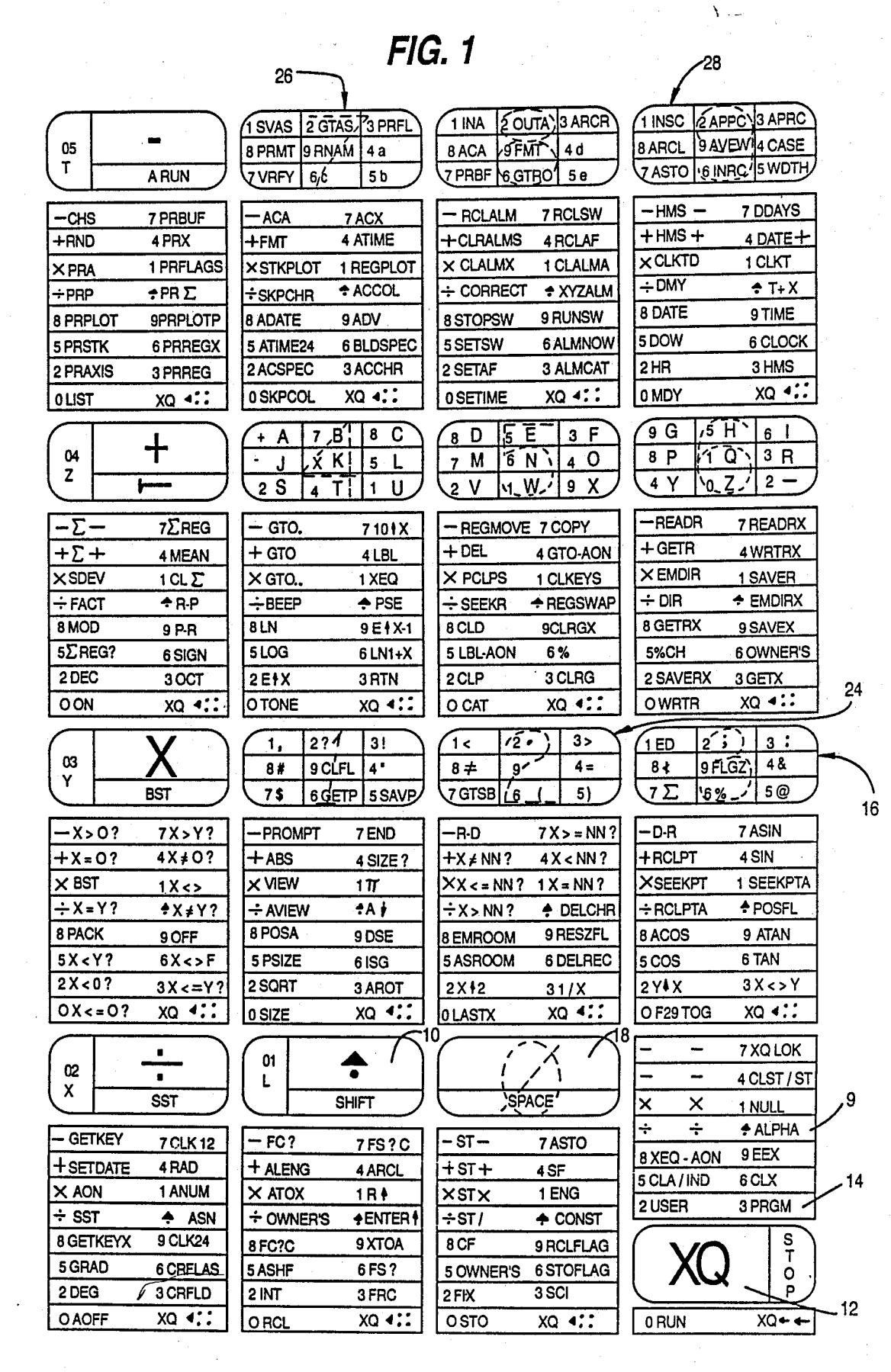
Figure 2:
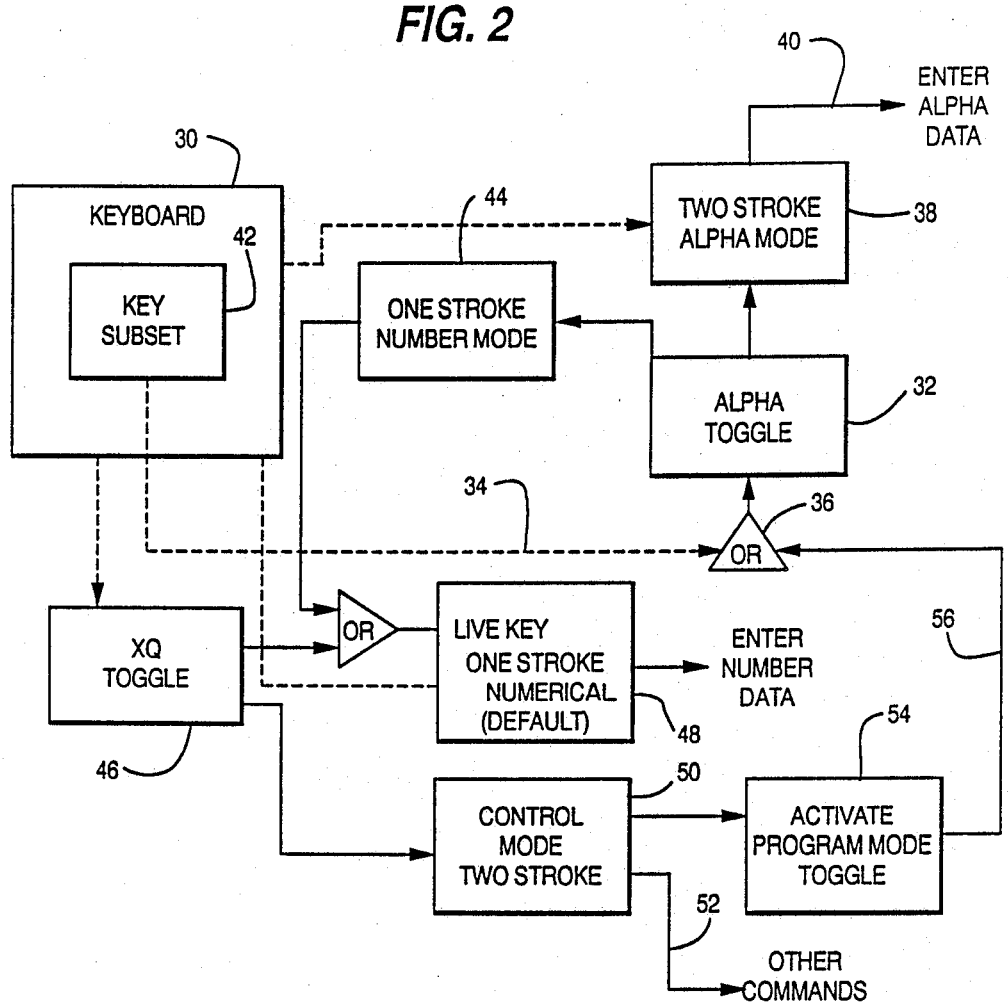
FIG. 2 is a block system diagram of a control means afforded in a preferred embodiment of the invention.

In the keyboard of FIG. 1, sixteen keys are provided with spacings for ready manual access, with primary live keyboard mode labels for the ten decimal digits 0 through 9 as indicated by the dashed line numbers, a decimal point (key 10), arithmetic functions of subtract, add, multiply and divide, and a control or mode shift key XQ 12. In the live keyboard entry mode the successive digits of a multiple digit decimal number are entered by single keystrokes until the second stroke of the decimal point key 10 which ends the number and enters it into a respective calculator memory location. This may be done since numbers never encounter a second decimal point, and all numbers have at least one decimal point even if not identified.

The entered data is then subject to the conventional commands such as the arithmetic commands directly available by a single keystroke. Also, any of the other multiplicity of secondary commands, whose functions are abbreviated in the chart sections directly under the keys may be selected. Appropriate calculator program subroutines are selected by entry of the commands.

For the entry of secondary commands the XQ (execute) key 12 immediately places the calculator in a multiple choice command entry control mode. For a command selection in this mode, two successive key strokes of a predetermined combination of the sixteen keys is required. Thus, if the command selection desired is located in the charted blocks under the keys, the primary first key stroke is shown by location of the chart. For example, to enter the program mode (in the lower right hand corner) as indicated by block 14 labelled PRGM, the XQ 12 key is first stroked twice and then the numeric "3" key identified in the function chart by reference number 16 is stroked. This will put the calculator into a numeric entry mode for live entry of the data from the numeric keys.

Now in accordance with this invention, a third command tier may be used to enter the alphanumeric mode. The two sequential key strokes to enter this mode (see lower right corner) are made with the XQ 12 and the entry/decimal point (▲) key 10.

In this alpha mode, the decimal point key 10 becomes the entry key and the zero key 18 becomes the space key, as noted by the respective key indicia. Also, in this alpha mode, the number one to nine keys are activated for a data and a command entry mode in response to two key strokes from predetermined combinations of that subset of nine keys. Again the choices are noted on the respective key indicia charts.

For alphanumeric mode, capital E is selected by a 5-5 key stroke sequence, the key having reference number 20, for example, while a lower case e is selected by an 8-5 key stroke sequence (reference numbers 22 and 20 respectively). Note that since the period or decimal key 10 is now in the alpha entry key mode, the decimal or period is selected by a 2-2 keystroke sequence (the key having reference number 24). Also, note that commands may be selected in the alpha mode, such as "Rename" produced by the 7-9 key stroke sequence (reference numbers 26 and 28 respectively). Thus, with the subset of the nine numerical digit keys, eighty-one selections are made, including a full 26 character alphabet and all accompanying symbols generally found on a typewriter keyboard.

To select numbers on a live keyboard in this mode, the decimal point key 10 serves as an alpha toggle to select either numerical or alpha modes. This retains the higher speed advantage of entering numerical data with a single key stroke per numerical digit. The enter function as aforesaid for any number is by two successive strokes of the enter/decimal key . (10), and similarly in the alpha mode the enter function following an alpha entry is by two successive strokes of that key.

To exit the alpha mode, the original alpha toggle XQ decimal point (▲) sequence is used (keys 12 and 10 respectively). To exit the program mode, the XQ-3 sequence is used for activating the program toggle. In this case the default function alpha off is initiated. Clearly therefore the present invention offers a very simple and rapid way to write program steps in the alpha mode, and surprisingly permits a full selection of all typewriter key functions and 27 additional command (or data) entries with only twelve keys. (The numerical calculation function keys −, +, ×, ÷ not being required.)

The system organization is shown in the block functional flow diagram of FIG. 2. The key actuation function flow lines from the keyboard 30 are shown in dotted line form. Pertinent control function interactions are shown in full line form.

The novel feature afforded by this invention of unexpectedly greater keyboard capacity with a few keys, such as sixteen, for selection of a great number of command functions and all the alphabetic character selections usually performed on a full keyboard typewriter of over 50 keys is achieved by this system, in the manner hereinbefore described in connection with the keyboard of FIG. 1. Additional novel features in the alphabetic mode of operation are provided, including the capacity to rapidly enter alphabetic information in the program mode for writing program steps.

Thus, the alphabetic mode toggle 32 is actuated by the alpha command initiated by the two stroke sequence of the XQ key 12 and the decimal point key 10 in the control mode, as represented along key actuation flow line 34, through OR circuit 36. This selects the alpha mode 38 where alphabetic data output characters are generated at 40 in response to two key strokes from the subset 42 of key as hereinbefore described. The toggle is converted to the live key single stroke number entry mode 44 by further actuation of alpha toggle 32 from the keyboard 30 along line 34, such as by the use of the decimal key two stroke entry function, converted to this mode of operation in the alpha mode. Thus, alphanumeric entry from a few keys is feasible without relinquishing the desirable fast entry of numerical data with one stroke live keyboard operation. In the two stroke alpha mode, the alphabetic characters are successively entered with each two stroke selection into a word until spaced by the space (0) key 18. This operation saves considerable time in entry of alpha data in the program mode to be discussed hereinafter. Note that line 34 is activated in the control mode.

In addition to the subset of keys 42, there is an XQ toggle 46 which upon receiving a two stroke sequence XQ XQ operates toggle 46 to convert from the default condition of live key single stroke numerical entry mode 48 to the control mode 50 providing a set of commands such as 52 including the program mode activation toggle 54. By means of lead 56 and OR circuit 36 the alpha toggle 32 is activated to operate in the program mode for selection of either the default numeric live keyboard mode via 44 or the two stroke alphabetic entry mode via 38. Thus, the program steps may be quickly entered including any of the alphabetic characters with a minimum of command control function operations and with a minimum of keys, far fewer than conventionally needed on prior state of the art calculators capable of handling one full alphabetic.

Although the preferred embodiment as discussed above used sixteen keys for the most efficacious operation, it is possible to achieve complete entry of all 26 alpha keys and the ten numeric keys with only six keys as is illustrated in FIG. 3. However, as can be seen the use of six keys in this manner does not allow the use of a decimal or control keys. Therefore, to use such a keyboard effectively, it is possible of course to eliminate some of the lesser used alpha keys such as the Q key 58 or the X key 60, or any other low case key. This technique would allow the use of a decimal key or "shift key" to allow the use of another mode.

Figure 4:
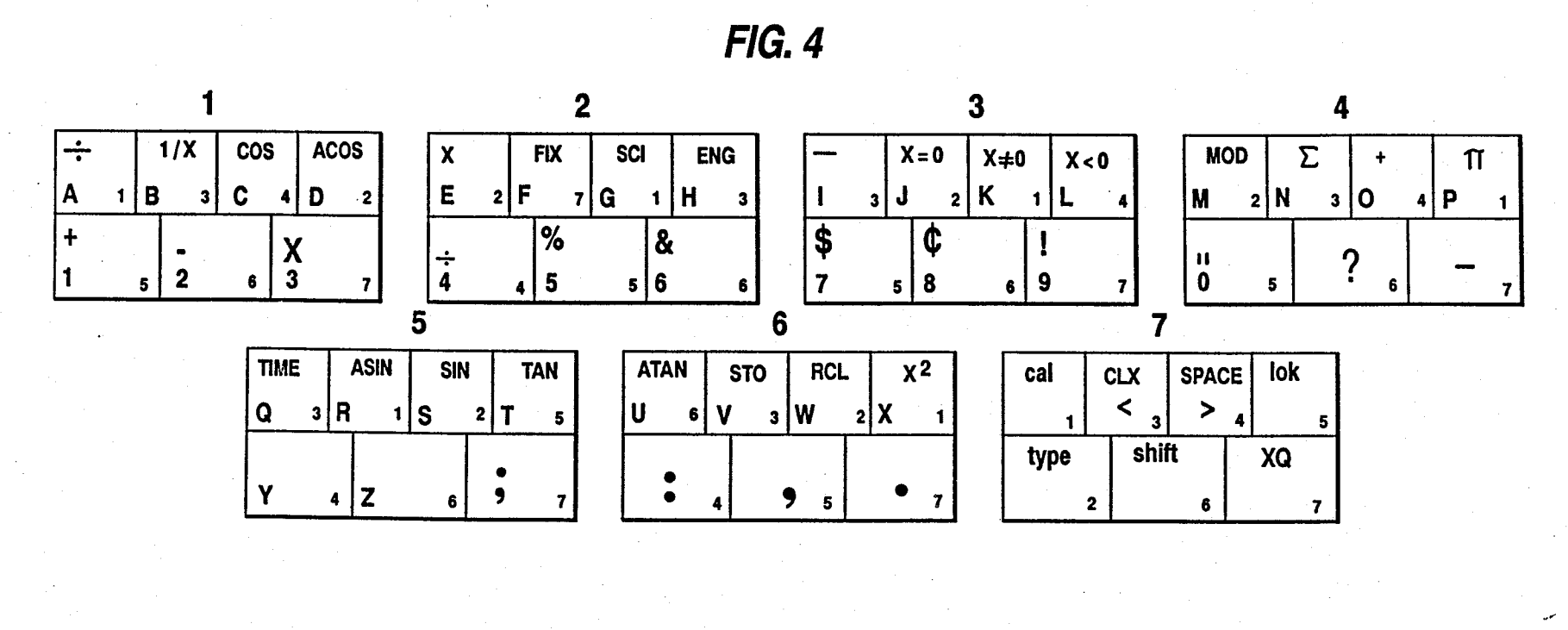

By the use of seven keys however, the full alphabet, a decimal function and a some control functions are available consequently, seven keys such as shown in FIG. 4 may represent the reasonable minimum number of keys.

Although functioning keyboards which use only six or seven keys are possible, a twelve key keyboard such as shown in FIG. 5 probably represents the truly working minimum number of keys. Although not graphically illustrated in addition to providing alpha entry wherein an alpha mode, the 4, 5 and 6 keys may be used to provide any other desired function in the normal mode. Similarly, the remaining keys (1, 2, 3, 7, 8, 9 . , 0 and XQ) may be used to enter a great number of functions in a two stroke mode.

Having therefore advanced the state of the art, those novel features believed descriptive of the nature and spirit of the invention are defined with particularity in the following claims.

I claim:

1. The method of operating a programmable alphanumeric calculator system to select an initial command function, a plurality of calculator command functions, numeric digits and alphabetic characters from a plurality of keys on a keyboard, comprising the steps of:

providing said initial command function from said keyboard to enter a control mode in which said calculator command functions may be entered from said keyboard, establishing a program mode from said keyboard to enable writing of a program as one of said plurality of calculator command functions, establishing an alpha entry sub-mode in the program mode for entry of a selected set of the order of twenty six alphabetic characters from a subset of keys numbering substantially fewer than twenty six, and entering alphabetic characters by two sequential keystrokes in the alpha entry mode from predetermined combinations of the keys in said subset of keys.

2. The method defined in claim 1, further comprising the step of:

controlling the computer operation in the program mode from one of said calculator command functions entered by selected keyboard keys to enter numericl digits into a program for said calculator system in a single stroke per entry mode.

* * * * *